United States Patent
Pihale et al.

(10) Patent No.: US 9,840,647 B2
(45) Date of Patent: Dec. 12, 2017

(54) OPTOELECTRONIC COMPONENT COMPRISING A BONDING LAYER AND METHOD FOR PRODUCING A BONDING LAYER IN AN OPTOELECTRONIC COMPONENT

(71) Applicant: OSRAM Opto Semiconductors GmbH, Regensburg (DE)

(72) Inventors: Sven Pihale, Ellingen (DE); Florian Eder, Erlangen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/036,534

(22) PCT Filed: Nov. 5, 2014

(86) PCT No.: PCT/EP2014/073829
§ 371 (c)(1),
(2) Date: May 13, 2016

(87) PCT Pub. No.: WO2015/074877
PCT Pub. Date: May 28, 2015

(65) Prior Publication Data
US 2016/0298011 A1    Oct. 13, 2016

(30) Foreign Application Priority Data
Nov. 20, 2013    (DE) .................. 10 2013 112 826

(51) Int. Cl.
*H01L 21/00* (2006.01)
*C09J 183/14* (2006.01)
(Continued)

(52) U.S. Cl.
CPC .......... *C09J 183/14* (2013.01); *H01L 33/505* (2013.01); *H01L 33/507* (2013.01); *H01L 33/56* (2013.01);
(Continued)

(58) Field of Classification Search
CPC ....... H01L 33/56; H01L 33/62; H01L 33/507; H01L 2224/48091; H01L 33/60
(Continued)

(56) References Cited

U.S. PATENT DOCUMENTS 6,271,292 B1 *   8/2001   Mager .................. C08K 3/0008
                                                          524/261
7,301,175 B2    11/2007   Izuno et al.
(Continued)

FOREIGN PATENT DOCUMENTS

CN    1476640 A      2/2004
CN    102816438 A   12/2012
(Continued)

*Primary Examiner* — Andy Huynh
(74) *Attorney, Agent, or Firm* — Slater Matsil, LLP

(57) ABSTRACT

An optoelectronic component and a method for manufacturing an optoelectronic component are provided. In an embodiment, the optoelectronic component includes a layer sequence having an active layer configured to emit electromagnetic primary radiation, a converter lamina disposed in a beam path of the electromagnetic primary radiation and a bonding layer disposed between the layer sequence and the converter lamina, wherein the bonding layer comprises an inorganic-organic hybrid material having Si—O—Al bonds and/or Si—O—Zr bonds.

9 Claims, 2 Drawing Sheets

(51) Int. Cl.
*H01L 33/50* (2010.01)
*H01L 33/56* (2010.01)
*C08G 77/58* (2006.01)

(52) U.S. Cl.
CPC ........ *C08G 77/58* (2013.01); *H01L 2933/005* (2013.01); *H01L 2933/0041* (2013.01)

(58) Field of Classification Search
USPC .............................................. 257/98; 438/22
See application file for complete search history.

(56) References Cited

U.S. PATENT DOCUMENTS

| | | | | |
|---|---|---|---|---|
| 2010/0155666 | A1* | 6/2010 | Fujita | ................. C03C 8/08 |
| | | | | 252/301.4 P |
| 2010/0308362 | A1* | 12/2010 | Herrmann | ............... H01L 33/44 |
| | | | | 257/98 |
| 2011/0248314 | A1 | 10/2011 | Takei et al. | |
| 2012/0309885 | A1 | 12/2012 | Hirano | |
| 2013/0196843 | A1* | 8/2013 | Park | ................. C03C 25/40 |
| | | | | 501/32 |
| 2015/0115302 | A1 | 4/2015 | Eder et al. | |

FOREIGN PATENT DOCUMENTS

| | | |
|---|---|---|
| DE | 102010043378 A1 | 5/2012 |
| DE | 102012102859 A1 | 11/2013 |
| EP | 2065430 A1 | 6/2009 |
| EP | 1437776 B1 | 9/2011 |

\* cited by examiner

OPTOELECTRONIC COMPONENT COMPRISING A BONDING LAYER AND METHOD FOR PRODUCING A BONDING LAYER IN AN OPTOELECTRONIC COMPONENT

This patent application is a national phase filing under section 371 of PCT/EP2014/073829, filed Nov. 5, 2014, which claims the priority of German patent application 10 2013 112 826.2, filed Nov. 20, 2013, each of which is incorporated herein by reference in its entirety.

TECHNICAL FIELD

The invention relates to an optoelectronic component comprising a bonding layer and to a process for producing a bonding layer in an optoelectronic component.

BACKGROUND

Optoelectronic components, for example light-emitting diodes (LEDs), frequently have converter laminas comprising converter particles. Converter particles convert the radiation emitted by a radiation source to a radiation having an altered, for example longer, wavelength. This gives rise not only to the altered radiation emitted but also to heat. In conventional converter laminas, the converter particles are frequently embedded into silicone as matrix. However, silicone has insufficient dissipation of the heat developed by the converter particles. This gives rise to a buildup of heat in the conversion elements, which leads to a reduction in the illumination intensity and to a change in the color locus, and to early failure of the LED. The use of matrix materials having a higher thermal conductivity than silicone for the converter laminas on its own makes it possible to efficiently dissipate the heat. However, the converter laminae are typically bonded by means of a bonding layer of silicone. In that case, it is possible to efficiently dissipate the heat developed into the matrix material in the converter lamina, but it remains in the converter lamina as a buildup of heat, since the heat cannot be dissipated through the strongly insulating silicone bonding layer.

SUMMARY

Embodiments provide an optoelectronic component comprising a bonding layer having improved thermal conductivity over the prior art. Further embodiments provide a process for producing a bonding layer in an optoelectronic component.

Advantageous executions and developments of the present invention are specified in the respective dependent claims.

In various embodiments an optoelectronic component is specified. The optoelectronic component comprises a layer sequence having an active layer that emits electromagnetic primary radiation and a converter lamina disposed in the beam path of the electromagnetic primary radiation. The optoelectronic component further comprises a bonding layer disposed between the layer sequence and the converter lamina. The bonding layer comprises an inorganic-organic hybrid material having Si—O—Al bonds and/or Si—O—Zr bonds.

The fact that a layer or an element is disposed "between" two other layers or elements here and hereinafter can mean that this one layer or one element is disposed in direct mechanical and/or electrical contact or in indirect contact with one of the two other layers or elements, and in direct mechanical and/or electrical contact or electrical or in indirect contact with others among the two other layers or elements. In this case, given indirect contact, further layers and/or elements may be disposed between this one and at least one of the two other layers, or between this one and at least one of the two other elements.

"Layer sequence" in this context is understood to mean a layer sequence comprising more than one layer, for example a sequence of a p-doped and an n-doped semiconductor layer, with the layers arranged one on top of another.

The layer sequence may be executed as an epitaxial layer sequence or as a radiation-emitting semiconductor chip having an epitaxial layer sequence, i.e. as a semiconductor layer sequence grown by epitaxial means. In this case, the layer sequence may be executed, for example, on the basis of InGaAlN. InGaAlN-based semiconductor chips and semiconductor layer sequences are especially those where the semiconductor layer sequence produced by epitaxy has a layer sequence composed of different individual layers comprising at least one individual layer including a material composed of the III-V compound semiconductor material system $In_xAl_yGa_{1-x-y}N$ with $0 \leq x \leq 1$, $0 \leq y \leq 1$ and $x+y \leq 1$. Semiconductor layer sequences having at least one active layer based on InGaAlN can emit, for example, electromagnetic radiation in an ultraviolet to green wavelength range.

Alternatively or additionally, the semiconductor layer sequence or the semiconductor chip may also be based on InGaAlP, meaning that the semiconductor layer sequence may include different individual layers, of which at least one individual layer includes a material composed of the III-V compound semiconductor material system $In_xAl_yGa_{1-x-y}P$ with $0 \leq x \leq 1$, $0 \leq y \leq 1$ and $x+y \leq 1$.

Semiconductor layer sequences or semiconductor chips including at least one active layer based on InGaAlP may, for example, preferentially emit electromagnetic radiation having one or more spectral components in a green to red wavelength range.

Alternatively or additionally, the semiconductor layer sequence or the semiconductor chip may also include other III-V compound semiconductor material systems, for example an AlGaAs-based material, or II-VI compound semiconductor material systems. More particularly, an active layer including an AlGaAs-based material may be suitable for emitting electromagnetic radiation having one or more spectral components in a red to infrared wavelength range.

The active semiconductor layer sequence may, as well as the active layer, comprise further functional layers and functional regions, for instance p- or n-doped charge carrier transport layers, i.e. electron or hole transport layers, undoped or p- or n-doped confinement, cladding or waveguide layers, barrier layers, planarization layers, buffer layers, protective layers and/or electrodes, and combinations thereof. In addition, it is possible, for example, for one or more mirror layers to be applied to a side of the semiconductor layer sequence facing away from the growth substrate. The structures described here in relation to the active layer or the further functional layers and regions are known to those skilled in the art, particularly in terms of construction, function and structure, and for that reason will not be elucidated in detail at this point.

In one embodiment, the converter lamina comprises converter particles which at least partly convert the electromagnetic primary radiation to an electromagnetic secondary radiation.

The fact that the converter particles convert the electromagnetic primary radiation at least partly to an electromagnetic secondary radiation can mean firstly that the electromagnetic primary radiation is at least partly absorbed by the converter particles and emitted as secondary radiation having a wavelength range at least partly different from the primary radiation. A portion of the primary radiation absorbed is released here as heat by the converter particles. The electromagnetic primary radiation and electromagnetic secondary radiation may include one or more wavelengths and/or wavelength ranges in an infrared to ultraviolet wavelength range, especially in a visible wavelength range. In this case, the spectrum of the primary radiation and/or the spectrum of the secondary radiation may be narrow-band, meaning that the primary radiation and/or the secondary radiation can have a monochrome or near-monochrome wavelength range. The spectrum of the primary radiation and/or the spectrum of the secondary radiation may alternatively also be broad-band, meaning that the primary radiation and/or the secondary radiation can have a mixed-color wavelength range, where the mixed-color wavelength range can have a continuous spectrum or several discrete spectral components having different wavelengths. For example, the electromagnetic primary radiation can have a wavelength range composed of an ultraviolet to green wavelength range, while the electromagnetic secondary radiation can have a wavelength range composed of a blue to infrared wavelength range. More preferably, the superimposition of the primary radiation and the secondary radiation can give an impression of white illumination. For this purpose, the primary radiation can preferably give an impression of blue illumination and the secondary radiation an impression of yellow illumination, which can arise through spectral components of the secondary radiation in the yellow wavelength range and/or spectral components in the green and red wavelength range.

The fact that the converter particles at least partly convert the electromagnetic primary radiation to an electromagnetic secondary radiation can also mean that the electromagnetic primary radiation is virtually fully absorbed by the converter particles and released in the form of an electromagnetic secondary radiation and in the form of heat. The emitted radiation from the optoelectronic component in this embodiment thus corresponds virtually fully to the electromagnetic secondary radiation. Virtually full conversion is understood to mean a conversion of more than 90%, especially more than 95%.

By virtue of a bonding layer comprising an inorganic-organic hybrid material having Si—O—Al bonds and/or Si—O—Zr bonds, the heat developed by the converter particles can surprisingly be very well dissipated in the converter lamina. This gives rise to only a small or negligible buildup of heat in the converter lamina, and it is possible to guarantee a constant illumination intensity and a constant color locus over the length of the operating life of the optoelectronic component. It is thus possible to prevent premature failure of the optoelectronic component and extend the lifetime of the optoelectronic component. In addition, this bonding layer achieves very good adhesion of the layer sequence and the converter lamina.

In one embodiment, the bonding layer has a thermal conductivity between 0.25 W/mK and 1.0 W/mK, preferably between 0.3 W/mK and 1.0 W/mK.

In one embodiment, the bonding layer is transparent to the electromagnetic primary radiation emitted by the active layer of the layer sequence. "Transparent" in the present context is understood to mean that a material, a layer or an element is at least partly transparent to the entire visible electro-magnetic spectrum or a sub-spectrum thereof. The radiation emitted by the active layer of the layer sequence may, for example, be within the visible range of the electromagnetic spectrum.

In one embodiment, the inorganic-organic hybrid material comprises Si—O—Si, Al—O—Al and Si—O—Al bonds, Si—O—Si, Zr—O—Zr and Si—O—Zr bonds, or Si—O—Si, Al—O—Al, Si—O—Al, Zr—O—Zr, Si—O—Zr and Al—O—Zr bonds.

In one embodiment, the converter lamina comprises converter particles and an inorganic-organic hybrid material and/or a silicate glass and/or a ceramic, wherein the converter particles are distributed within the inorganic-organic hybrid material and/or the silicate glass and/or the ceramic. It is a feature of the inorganic-organic hybrid material and/or the silicate glass and/or the ceramic that they have a higher thermal conductivity than silicone. Thus, here and hereinafter, silicone is not covered by the definition of an inorganic-organic hybrid material. For example, the thermal conductivity is between 0.2 W/mK and 10.0 W/mK for an inorganic-organic hybrid material and/or a silicate glass, and between 10 W/mK and 12 W/mK for a ceramic. In this embodiment, the heat developed in the conversion of the electromagnetic primary radiation can be removed from the converter lamina efficiently through the inorganic-organic hybrid material and/or the silicate glass and/or the ceramic of the converter lamina and the inorganic-organic hybrid material of the bonding layer.

In one embodiment, the inorganic-organic hybrid material of the bonding layer is produced by chemical reactions, such as hydrolysis and co-condensation or hydrolysis, co-condensation and crosslinking of at least one compound of the formula I, at least one compound of the formula II and at least one compound of the formula III:

Formula I

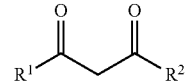

Formula II

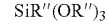

Formula III where
M=Al or Zr,
R, R', $R^1$, $R^2$ may be chosen identically or differently and are each hydrogen and/or an organic radical,
R" is an organic radical having an epoxy group or an organic radical having an isocyanate group
and x=3 or 4.

In one embodiment, the inorganic-organic hybrid material is produced by chemical reactions, such as hydrolysis and co-condensation or hydrolysis, co-condensation and crosslinking of at least one compound of the formula I, at least one compound of the formula II, at least one compound of the formula III and at least one compound of the formula IV

Formula I

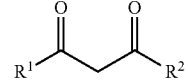

Formula II $$SiR''(OR')_3 \quad \text{Formula III}$$

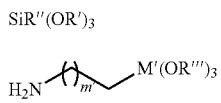
Formula IV

Where

M=Al or Zr,

R, R', R$^1$, R$^2$, R''' may be chosen identically or differently and are each hydrogen and/or an organic radical, R'' is an organic radical having an epoxy group or an organic radical having an isocyanate group, x=3 or 4, M'=Si or Zr, and m'=0, 1, 2, 3, 4 or 5.

It has been found that a bonding layer comprising such an inorganic-organic hybrid material is stable to thermal and radiative effects to which it is exposed in an optoelectronic component. This ensures that the bonding layer is not degraded and retains its very good bonding properties over the lifetime of the optoelectronic component.

Through a hydrolysis, the OR— and OR'— groups or the OR—, OR'— and OR'''— groups on the central M and Si or M, Si and M' atoms are at least partly replaced by OH groups. Two OH groups can form M-O-M, M'-O-M', Si—O—Si, Si—O-M, M'-O-M and Si—O-M' bonds through a condensation reaction with the elimination of H$_2$O. It is also possible that one OH group and one M-O—R, M'-OR''' or Si—OR'' group form R'''—OH or R'—OH, M-O-M, M'-O-M', Si—O—Si, Si—O-M, M'-O-M and Si—O-M' bonds through a condensation reaction with the elimination of R—OH. More particularly, this forms Si—O—Si, Al—O—Al and Si—O—Al bonds, Si—O—Si, Zr—O—Zr and Si—O—Zr bonds, or Si—O—Si, A—O—Al, Si—O—Al, Zr—O—Zr, Si—O—Zr and A—O—Zr bonds.

If a compound of the formula IV is used for production of the inorganic-organic hybrid material, the crosslinking or reaction of the NH$_2$ group in the compound of the formula IV with, for example, compounds of the formulae I, III and IV, hydrolyzed compounds of the formulae I, III and IV, or else condensed compounds, can form N—Si and N—Al bonds, N—Si and N—Zr bonds, or N—Si, N—Zr and N—Al bonds. The use of a compound of the formula IV can increase the elasticity and flexibility of the inorganic-organic hybrid material.

By virtue of an R'' group on the Si in the compound of the formula III which represents an organic radical having an isocyanate group, the compounds of the formula III, hydrolyzed compounds of the formula III and/or the condensation products can additionally crosslink with compounds of the formulae I, III and IV, hydrolyzed compounds of the formulae I, III and IV having at least one OH group or NH$_2$ group. The crosslinking gives rise to stable bonds within the inorganic-organic hybrid material which also remain stable through interactions with electromagnetic radiation. By virtue of the additional crosslinking, the inorganic-organic hybrid material thus produced has a very high chemical stability, for example with respect to moisture as well.

In one embodiment, the bonding layer has a layer thickness of 1 µm to 25 µm, preferably between 1 µm to 10 µm and more preferably between 1 µm to 5 µm.

In one embodiment, there are chemical bonds between the bonding layer and the layer sequence and/or between the bonding layer and the converter lamina. Chemical bonds may be understood to mean covalent bonds, ionic bonds or else coordinate bonds. More particularly, there are covalent bonds between the bonding layer and the layer sequence and/or between the bonding layer and the converter lamina. The chemical attachment enables very good bonding of the layer sequence and the converter lamina in the optoelectronic component. The good bonding of the layer sequence and the converter lamina prevents early delamination of the two elements, and it is thus possible to prolong the lifetime of the optoelectronic component. By comparison, silicone can enter into few if any covalent bonds because of the chemical composition.

The optoelectronic component may, for example, comprise luminescent diodes, photodiode transistor arrays/modules and optical couplers.

Additionally specified is a process for producing a bonding layer in an optoelectronic component. The bonding layer comprises an inorganic-organic hybrid material and is disposed between a layer sequence having an active layer and a converter lamina in an optoelectronic component. The process comprises the following process steps:

A) providing a layer sequence having an active layer and a converter lamina,

B) producing an adhesive,

C) applying the adhesive to the layer sequence or to the converter lamina,

D) positioning the converter lamina atop the layer sequence or positioning the layer sequence atop the converter lamina, E) curing the adhesive to form the bonding layer.

Process step B) comprises the following process steps:

B1) providing a first reaction mixture comprising at least one compound of the formula III or at least one compound of the formula III and a compound of the formula IV

Formula III

Formula IV

The following applies to formula III:

R' is hydrogen and/or an organic radical and

R'' is an organic radical having an epoxy group or an organic radical having an isocyanate group.

The following applies to formula IV:

M'=Si or Zr, m'=0, 1, 2, 3, 4 or 5,

R''' is hydrogen and/or an organic radical,

B2) adding a solution comprising a compound of the formula I and a compound of the formula II dropwise to the first reaction mixture to form a second reaction mixture

Formula I

Formula II

The following applies to formula I:

M=Al or Zr,

R is hydrogen and/or an organic radical, and x=3 or 4.

The following applies to formula II:

R¹ and R² may be chosen identically or differently and are each hydrogen and/or an organic radical.

With such a process, it is possible to produce an optoelectronic component according to the above details.

In one embodiment, the first reaction mixture in process step B1) consists of a compound of the formula III or of a compound of the formula III and a compound of the formula IV.

In one embodiment, the first reaction mixture in process step B1) comprises a first and second compound of the formula III or a first and second compound of the formula III and a compound of the formula IV.

In one embodiment, the first reaction mixture in process step B1) consists of a first and second compound of the formula III or of a first and second compound of the formula III and a compound of the formula IV.

In one embodiment, the following applies to the first compound of the formula III: R" is an organic radical having an epoxy group, and the following applies to the second compound of the formula III: R" is an organic radical having an isocyanate group. A reaction of the first compound of the formula III and the second compound of the formula III can give rise to compounds which have Si—O—Si bonds and/or which have stable bonds because of the reaction of the isocyanate group.

In one embodiment, the solution in process step B2) consists of a compound of the formula I and a compound of the formula II.

In one embodiment, the compound of the formula II serves to complex the compound of the formula I. This firstly allows the compound of the formula I to be kept in solution and secondly allows the reactivity thereof to be lowered.

In one embodiment, the application of the adhesive to the layer sequence in process step C) takes place by needle dispensing or jetting.

In one embodiment, process step B2) is followed by a further process step:

B3) adding an acid to the second reaction mixture to form a third reaction mixture.

In one embodiment, the acid is selected from a group comprising HCl, HNO₃ and H₂SO₄. In one embodiment, the pH of the acid is between 1 and 4.

In one embodiment, the compound of the formula I and the compound of the formula II are used in a molar ratio of 5:1 to 1:1.

In one embodiment, the compound of the formula IV and the at least one compound of the formula III for formation of the first reaction mixture are used in a molar ratio of 1:10 to 1:15.

In one embodiment, the compound of the formula I and the at least one compound of the formula III are used in a molar ratio of 1:1 to 1:10.

In one embodiment, process step B1) is followed by a further process step:

B1a) cooling the first reaction mixture to a temperature selected from the range of 1° C. to 15° C.

In one embodiment, the first, second and/or third reaction mixture is kept at a constant temperature selected from the range of 1° C. to 15° C.

In one embodiment, the first, second and/or third reaction mixture is stirred for 5 minutes to 24 hours before being followed by a further process step. For example, the first reaction mixture is stirred for 10 minutes to 60 minutes, the second reaction mixture for 3 minutes to 120 minutes, and the third reaction mixture for 120 minutes to 24 hours. The stirring can be effected at a constant temperature selected from the range of 1° C. to 15° C.

In one embodiment, process step E) comprises the following process steps:
E1) preliminary curing of the adhesive,
E2) thermal post-curing of the adhesive.

In one embodiment, process step E1) takes place at room temperature. In this step, by-products such as volatile alcohols are evaporated out of the adhesive. In one embodiment, process step E2) takes place in an oven with a heating rate of 1-10 K/min up to a temperature of 120° C. to 160° C. The thermal post-curing can be effected for 0.5 to 2 h, preferably for 0.5 to 1 h.

By virtue of the gentle conditions that are sufficient for the curing in process step E), it is possible to guarantee that the further elements and layers of the optoelectronic component too, such as the layer sequence and the converter lamina, are not destroyed or impaired. The condensation products formed, mainly low molecular weight alcohols, exit in a gentle and homogeneous manner, such that virtually no blister formation, if any, takes place, nor do any gas channels remain in the bonding layer. By comparison, for example, ceramic adhesives are unsuitable for use in optoelectronic components firstly because of the high curing temperatures, and because of the condensation products of high molecular mass that exit, which lead to blister formation and to the formation of gas channels.

In one embodiment, the following applies to the compound of the formula III: R' is selected from a group comprising hydrogen, methyl, ethyl, propyl, isopropyl, butyl, isobutyl, sec-butyl, tert-butyl, cyclohexyl and phenyl radicals and combinations thereof. More preferably, R' is selected from a group comprising hydrogen, methyl, ethyl, propyl and isopropyl radicals and combinations thereof. For example, R' is a methyl radical.

In one embodiment, the compound of the formula III is a compound of the formula IIIa:

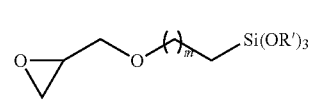

Formula IIIa where m=0, 1, 2, 3, 4 or 5, preferably m=1, 2 or 3, more preferably m=2. R' may be selected as specified for formula III. For example, R' is a methyl radical and the result is a compound of the formula IIIa':

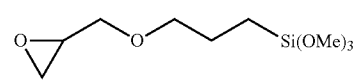

Formula IIIa"

In one embodiment, the first compound of the formula III is a compound of the formula IIIa and the second compound of the formula III is a compound of the formula IIId:

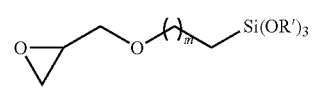

Formula IIIa

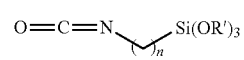

Formula IIId where the following applies to the compound of the formula IIId: n=1, 2, 3, 4 or 5, preferably 1, 2 or 3, more preferably 2 or 3. R' may be selected as specified for formula III.

In one embodiment, the following applies to the compound of the formula IV: R''' is selected from a group comprising hydrogen, methyl, ethyl, propyl, isopropyl, butyl, isobutyl, sec-butyl, tert-butyl, cyclohexyl and phenyl radicals and combinations thereof. More preferably, R''' is selected from a group comprising hydrogen, methyl, ethyl, propyl and isopropyl radicals and combinations thereof. For example, R''' is a methyl radical.

In one embodiment, the compound of the formula IV is a compound of the formula IVa:

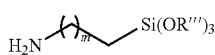

Formula IVa where m'=0, 1, 2, 3, 4 or 5, preferably m=1, 2 or 3, more preferably m=2. R''' may be selected as specified for formula IV. For example, the result is a compound of the formula IVa':

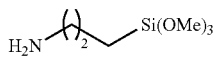

Formula IVa'

In one embodiment, the following applies to the compound of the formula I: R is selected from a group comprising hydrogen, methyl, ethyl, propyl, isopropyl, butyl, isobutyl, sec-butyl, tert-butyl, cyclohexyl and phenyl radicals and combinations thereof. More preferably, R is selected from a group comprising hydrogen, methyl, ethyl, propyl, isopropyl and sec-butyl radicals and combinations thereof. For example, R is a sec-butyl radical.

In one embodiment, the compound of the formula I has the following formula Ia or Ib:

 Formula Ia

 Formula Ib

R may be selected as specified for formula I.

In one embodiment, the following applies to the compound of the formula I: M=Al and x=3. For example, the result is a compound of the formula Ia':

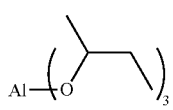

Formula Ia'

In one embodiment, the following applies to the compound of the formula II: $R^1$ and $R^2$ are each independently selected from a group comprising hydrogen, methyl, ethyl, propyl, isopropyl, methoxy, ethoxy, propoxy and isopropoxy radicals and combinations thereof. More preferably, $R^1$ is selected from a group comprising hydrogen, methyl, ethyl, propyl and isopropyl radicals and combinations thereof. More preferably, $R^2$ is selected from a group comprising methoxy, ethoxy, propoxy and isopropoxy radicals and combinations thereof. For example, the result is a compound of the formula IIa:

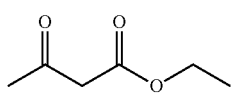

Formula IIa

All the features of the process for producing the bonding layer between a layer sequence and a converter lamina in an optoelectronic component also apply to the optoelectronic component.

BRIEF DESCRIPTION OF THE DRAWINGS

Further advantageous embodiments and developments of the invention are apparent from the working examples described hereinafter in conjunction with the figures.

Figure 1:
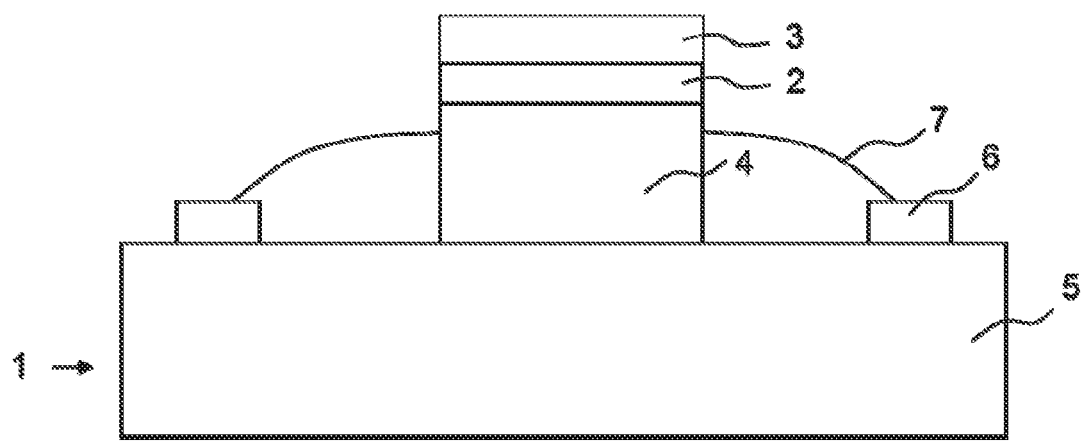
FIGS. 1 and 2 show schematic side views of various embodiments of optoelectronic components.

In the working examples and figures, constituents that are identical or have the same effect are each given the same reference numerals. The elements shown and their ratios of size with respect to one another should not be regarded as being to scale; instead, individual elements, especially layer thicknesses, may be shown in an exaggerated size for better understanding.

DETAILED DESCRIPTION OF ILLUSTRATIVE EMBODIMENTS

The optoelectronic component 1 according to FIG. 1 shows a carrier 5 with a leadframe 6. Disposed atop the carrier 5 is a layer sequence 4 electrically connected to the leadframe 6 via bonding wires 7. Disposed above the layer sequence 4 is a converter lamina 3. The converter lamina 3 comprises converter particles and an inorganic-organic hybrid material or converter particles and a silicate glass, with the converter particles distributed homogeneously, for example, within the inorganic-organic hybrid material or within the silicate glass. The converter lamina 3 is disposed in the beam path of the electromagnetic primary radiation which is emitted by an active layer (not shown here) in the layer sequence 4. Disposed between the layer sequence 4 and the converter lamina 3 is a bonding layer 2. The bonding layer 2 comprises an inorganic-organic hybrid material having Si—O—Si, Si—O—Al and Al—O—Al bonds or Si—O—Si, Si—O—Zr and Zr—O—Zr bonds. The bonding layer 2 can be produced as follows:

A) providing a layer sequence (4) having an active layer and a converter lamina (3), B) producing an adhesive, C) applying the adhesive to the layer sequence (4) or to the converter lamina (3), D) positioning the converter lamina (3) atop the layer sequence (4) or positioning the layer sequence (4) atop the converter lamina (3), E) curing the adhesive to form the bonding layer (2), where process step B) comprises the following process steps:

B1) providing a first reaction mixture comprising a compound of the formula IIIa

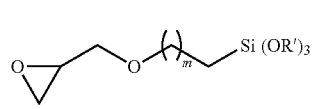

Formula IIIa where R' is selected from a group comprising hydrogen, methyl, ethyl, propyl and isopropyl radicals and combinations thereof and m=0, 1, 2, 3, 4 or 5, B2) adding a solution comprising a compound of the formula I and a compound of the formula II dropwise to the first reaction mixture

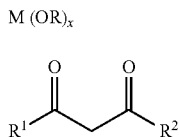

Formula I

Formula II where, in formula I:
M=Al or Zr,
R is selected from a group comprising hydrogen, methyl, ethyl, propyl, isopropyl and sec-butyl radicals and combinations thereof,
and x=3 when M=Al or x=4 when M=Zr;
and where, in formula II:
$R^1$ is selected from a group comprising hydrogen, methyl, ethyl, propyl and isopropyl radicals and combinations thereof. $R^2$ is selected from a group comprising methoxy, ethoxy, propoxy and isopropoxy radicals and combinations thereof.

Preferably, the optoelectronic component 1 is an LED, wherein the radiation in the figure is coupled out in the upward direction through a transparent layer sequence 4, the transparent bonding layer 2 and the transparent converter lamina 3.

Figure 2:
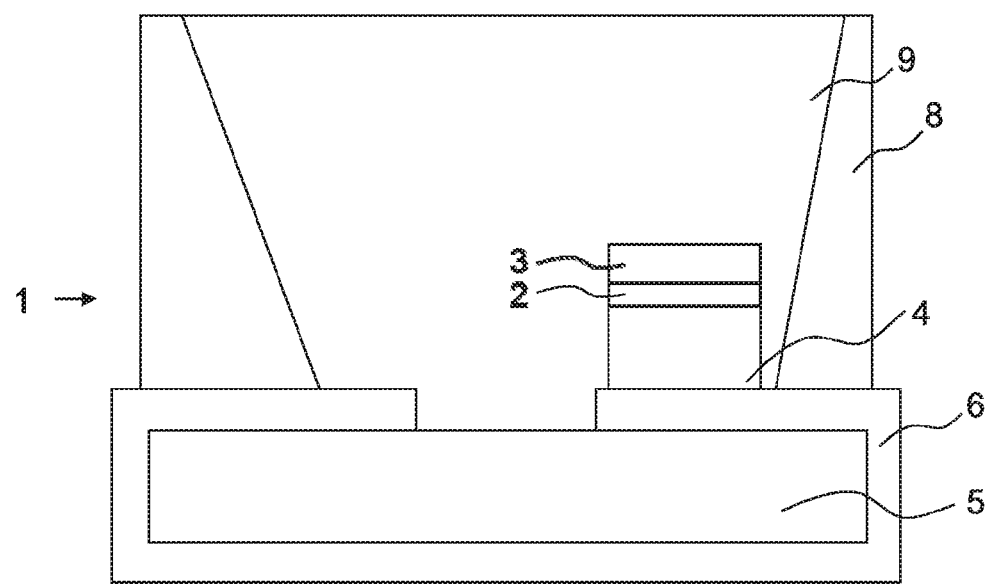

The optoelectronic component 1 according to FIG. 2 exhibits a carrier 5 with a leadframe 6 and a housing 8. The housing 8 has, in the middle, a recess with the layer sequence 4 electrically connected to the leadframe 6 disposed therein. The recess is filled with a potting material 9. The standard materials for the potting material 9 are known to those skilled in the art; one example is an epoxy resin. Disposed between the layer sequence 4 and the converter lamina 3 is a bonding layer 2. The bonding layer 2 comprises an inorganic-organic hybrid material having Si—O—Si, Si—O—Al and Al—O—Al bonds or Si—O—Si, Si—O—Zr and Zr—O—Zr bonds. The bonding layer can be produced as follows:

A) providing a layer sequence (4) having an active layer and a converter lamina (3),
B) producing an adhesive,
C) applying the adhesive to the layer sequence (4) or to the converter lamina (3),
D) positioning the converter lamina (3) atop the layer sequence (4) or positioning the layer sequence (4) atop the converter lamina (3),
E) curing the adhesive to form the bonding layer (2),
where process step B) comprises the following process steps:
B1) providing a first reaction mixture comprising a first compound (formula IIIa) and a second compound (formula IIId) of the formula III:

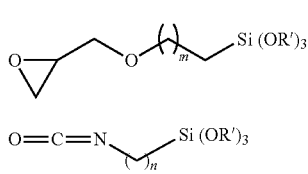

Formula IIIa

Formula IIId where each R' is independently selected from a group comprising hydrogen, methyl, ethyl, propyl and isopropyl radicals and combinations thereof,
m=0, 1, 2, 3, 4 or 5, and
n=1, 2, 3, 4 or 5,
B2) adding a solution comprising a compound of the formula I and a compound of the formula II dropwise to the first reaction mixture to form a second reaction mixture

Formula I

Formula II where, in formula I:
M=Al or Zr,
R is selected from a group comprising hydrogen, methyl, ethyl, propyl, isopropyl and sec-butyl radicals and combinations thereof,
and x=3 when M=Al or x=4 when M=Zr;
and where, in formula II:
$R^1$ is selected from a group comprising hydrogen, methyl, ethyl, propyl and isopropyl radicals and combinations thereof. $R^2$ is selected from a group comprising methoxy, ethoxy, propoxy and isopropoxy radicals and combinations thereof.

Preferably, the optoelectronic component 1 is an LED, wherein the radiation is coupled out in the upward direction through a transparent layer sequence 4, a transparent bonding layer and a transparent potting material 9.

Figure 3:
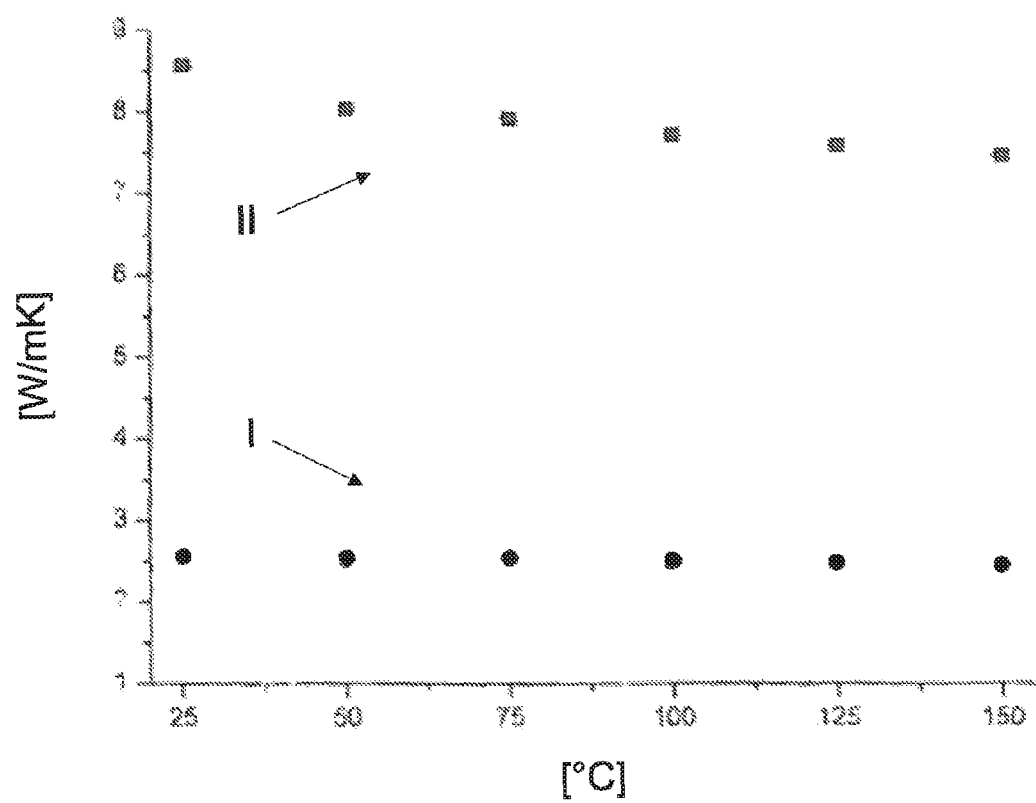
FIG. 3 shows the thermal conductivity of each of two silicon wafers bonded with a bonding layer.

FIG. 3 shows two thermal conductivities of each of two silicon wafers bonded with a bonding layer. Each bonding layer has a thickness of 25 μm. Each composite composed of two silicon wafers and a bonding layer disposed in between has a thickness of 0.6 mm. The silicon wafers each have an area of 1 cm×1 cm. Plotted on the y axis is the thermal conductivity in W/mK, and plotted on the x axis is the temperature T in ° C. The thermal conductivity of a composite of two silicon wafers bonded with a silicone bonding layer is assigned the thermal conductivity given the reference numeral I. The thermal conductivity of a composite of two silicon wafers bonded with an inventive bonding layer is assigned the thermal conductivity given the reference numeral II. The bonding layer of the invention is produced as follows:

B1) providing a first reaction mixture with 0.15 mol of glycidoxypropyltrimethoxysilane (formula IIIa") and 0.012 mol of aminopropyltrimethoxysilane (formula IVa')

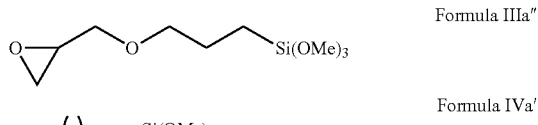

Formula IIIa"

Formula IVa'

B1a) cooling the first reaction mixture to a temperature between 1° C. and 15° C., leaving the first reaction mixture to stir for 20 minutes,
B2) adding a solution consisting of aluminum sec-butoxide (formula Ia') and ethyl acetoacetate (formula IIa) in a molar ratio of 5:1 to 1:1 dropwise to the first reaction mixture to form a second reaction mixture $$Al{-\!\!\left(O{-\!\!\left<\right>}\right)_3}\quad\text{Formula Ia}'$$

$$\underset{R^1}{\overset{O}{\|}}\!\!\!\diagdown\!\!\!\underset{}{\overset{O}{\|}}\!\!\!\diagup\!\!\!\underset{O}{}\quad\text{Formula IIa}$$

stirring the second reaction mixture for 60 minutes,

B3) adding HCl having a pH between 1 and 4 to the second reaction mixture to form a third reaction mixture, leaving the third reaction mixture to stir for 2 h, stirring the third reaction mixture for several hours to form the adhesive, C) applying the adhesive to a silicon wafer, D) positioning a further silicon wafer, E) curing the adhesive to form the bonding layer, comprising the process steps of:

E1) preliminary curing of the adhesive at room temperature for 30 to 60 minutes, E2) thermal post-curing of the adhesive in an oven with a heating rate of 1-10 K/min up to a temperature of 130° C. for 0.5 to 2 h.

It is found that the composite having the bonding layer of the invention, as compared with the composite having the silicone bonding layer, over a temperature range from 25° C. to 150° C., has 3 to 3.5 times as high a thermal conductivity. Moreover, the thermal conductivity II of the composite having the bonding layer of the invention is virtually stable over the temperature range from 25° C. to 150° C. shown.

The invention is not restricted by the description with reference to the working examples. Instead, the invention encompasses every novel feature and every combination of features, which especially includes every combination of features in the claims, even if this feature or this combination itself is not explicitly specified in the claims or working examples.

The invention claimed is:

1. A method for producing a bonding layer comprising an inorganic-organic hybrid material between a layer sequence having an active layer and a converter lamina in an optoelectronic component, the method comprising:
   providing the layer sequence having the active layer and the converter lamina;
   producing an adhesive;
   applying the adhesive to the layer sequence or to the converter lamina;
   positioning the converter lamina atop the layer sequence or positioning the layer sequence atop the converter lamina; and
   curing the adhesive to form the bonding layer,
   wherein producing the adhesive comprises:
      providing a first reaction mixture comprising at least one compound of the formula III or at least one compound of the formula III and a compound of the formula IV:

$$\text{SiR}''(\text{OR}')_3 \quad\text{Formula III}$$

$$H_2N{-\!\!\left<\right>_{m'}}\!\!\!-M'(OR''')_3, \quad\text{Formula IV}$$

wherein, in formula III:
   R' is hydrogen and/or an organic radical, and
   R'' is an organic radical having an epoxy group or an organic radical having an isocyanate group, and wherein, in formula IV:
   M'=Si or Zr,
   m'=0, 1, 2, 3, 4 or 5,
   R''' is hydrogen and/or an organic radical,
   adding a solution comprising a compound of the formula I and a compound of the formula II dropwise to the first reaction mixture to form a second reaction mixture:

$$M(OR)_x \quad\text{Formula I}$$

$$\underset{R^1}{\overset{O}{\|}}\!\!\!\diagdown\!\!\!\underset{}{\overset{O}{\|}}\!\!\!\diagup\!\!\!\underset{R^2}{}\quad\text{Formula II}$$

wherein, in formula I:
   M=Al or Zr,
   R is hydrogen and/or an organic radical, and
   x=3 or 4, and wherein, in formula II:
   $R^1$ and $R^2$ may be chosen identically or differently and are each hydrogen and/or an organic radical.

2. The method according to claim 1, wherein the compound of the formula I and the at least one compound of the formula III are used in a molar ratio of 1:1 to 1:10.

3. The method according to claim 1, further comprising adding an acid to the second reaction mixture to form a third reaction mixture after adding the solution.

4. The method according to claim 1, wherein the following applies to the at least one compound of the formula III:
   R' is selected from a group comprising hydrogen, methyl, ethyl, propyl, isopropyl, butyl, isobutyl, sec-butyl, tert-butyl, cyclohexyl and phenyl radicals and combinations thereof.

5. The method according to claim 1, wherein the at least one compound of the formula III has the following formula IIIa:

$$\underset{}{\overset{O}{\triangle}}\!\!\!\diagup\!\!\!\diagdown\!\!\!O{-\!\!\left<\right>_m}\!\!\!-\text{Si}(OR')_3, \quad\text{Formula IIIa}$$

wherein m=0, 1, 2, 3, 4 or 5.

6. The method according to claim 1, wherein, while providing the first reaction mixture, the first reaction mixture comprises a first compound and a second compound of the formula III or a first compound and a second compound of the formula III and a compound of the formula IV, and wherein the following applies to the first compound of the formula III: R'' is an organic radical having an epoxy group, and the following applies to the second compound of the formula III: R'' is an organic radical having an isocyanate group.

7. The method according to claim 6, wherein the first compound of the formula III has the following formula IIIa and the second compound of the formula III has the following formula IIId:

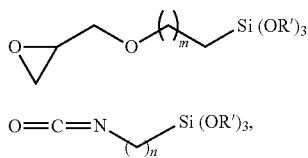

Formula IIIa

Formula IIId wherein R' is independently selected from the group consisting of hydrogen, methyl, ethyl, propyl, isopropyl, butyl, isobutyl, sec-butyl, tert-butyl, cyclohexyl and phenyl radicals and combinations thereof,
n=1, 2, 3, 4 or 5, and
m=0, 1, 2, 3, 4 or 5.

8. The method according to claim 1, wherein the compound of the formula I has the following formula Ia or Ib:

$Al(OR)_3$             Formula Ia $Zr(OR)_4$             Formula Ib, wherein R is selected from the group consisting of hydrogen, methyl, ethyl, propyl, isopropyl, butyl, isobutyl, sec-butyl, tert-butyl, cyclohexyl and phenyl radicals and combinations thereof.

9. The method according to claim 1, wherein the following applies to the compound of the formula I:
M=Al,
x=3, and
R is selected from a group comprising hydrogen, methyl, ethyl, propyl, isopropyl, butyl, isobutyl, sec-butyl, tert-butyl, cyclohexyl and phenyl radicals and combinations thereof.

\* \* \* \* \*